United States Patent
Jochemsen et al.

(10) Patent No.: US 10,852,646 B2
(45) Date of Patent: Dec. 1, 2020

(54) DISPLACEMENT BASED OVERLAY OR ALIGNMENT

(71) Applicant: ASML NETHERLANDS B.V., Veldhoven (NL)

(72) Inventors: Marinus Jochemsen, Veldhoven (NL); Scott Anderson Middlebrooks, Duizel (NL); Stefan Hunsche, Santa Clara, CA (US); Te-Sheng Wang, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 9 days.

(21) Appl. No.: 16/300,314

(22) PCT Filed: Apr. 20, 2017

(86) PCT No.: PCT/EP2017/059371
§ 371 (c)(1),
(2) Date: Nov. 9, 2018

(87) PCT Pub. No.: WO2017/194285
PCT Pub. Date: Nov. 16, 2017

(65) Prior Publication Data
US 2019/0146358 A1 May 16, 2019

Related U.S. Application Data

(60) Provisional application No. 62/335,430, filed on May 12, 2016.

(51) Int. Cl.
*G03F 7/20* (2006.01)

(52) U.S. Cl.
CPC ...... *G03F 7/70616* (2013.01); *G03F 7/70466* (2013.01); *G03F 7/70491* (2013.01); *G03F 7/70541* (2013.01); *G03F 7/70633* (2013.01)

(58) Field of Classification Search
CPC ........ G03F 1/84; G03F 9/7003; G03F 9/7007; G03F 9/7049; G03F 9/7053;
(Continued)

(56) References Cited

U.S. PATENT DOCUMENTS 5,969,441 A  10/1999 Loopstra et al.
7,587,704 B2  9/2009 Ye et al.
(Continued)

FOREIGN PATENT DOCUMENTS

KR  20100057527  5/2010
WO  2010059954  5/2010

OTHER PUBLICATIONS

International Search Report and Written Opinion issued in corresponding PCT Patent Application No. PCT/EP2017/059371, dated Aug. 14, 2017.
(Continued)

*Primary Examiner* — Christina A Riddle
(74) *Attorney, Agent, or Firm* — Pillsbury Winthrop Shaw Pittman LLP

(57) ABSTRACT

A method including obtaining an image of a plurality of structures on a substrate, wherein each of the plurality of structures is formed onto the substrate by transferring a corresponding pattern of a design layout; obtaining, from the image, a displacement for each of the structures with respect to a reference point for that structure; and assigning each of the structures into one of a plurality of groups based on the displacement.

21 Claims, 15 Drawing Sheets

(58) Field of Classification Search
CPC .............. G03F 9/7092; G03F 7/70466; G03F 7/70491–70541; G03F 7/70625; G03F 7/70633; G03F 7/7065; G03F 7/70666; G03F 7/70675; G03F 7/70683; G03F 7/70775; G03F 7/70616; G03F 7/70433
USPC ...... 355/46, 52–55, 61, 72, 77; 430/30, 394; 356/399–401, 614, 620, 601; 382/141, 382/144–145, 147, 149, 151, 199, 382/217–219; 250/492.1, 492.2, 492.21, 250/492.22, 492.3, 310, 311
See application file for complete search history.

(56) References Cited

U.S. PATENT DOCUMENTS

| | | | |
|---|---|---|---|
| 2009/0157360 A1 | 6/2009 | Ye et al. | |
| 2009/0208090 A1 | 8/2009 | Nishiura et al. | |
| 2009/0291512 A1* | 11/2009 | Izuha ................ | G06T 7/0004 438/16 |
| 2010/0315614 A1 | 12/2010 | Hansen | |
| 2012/0023464 A1* | 1/2012 | Lin .................... | G01N 21/8851 716/52 |
| 2015/0136976 A1 | 5/2015 | Matsuoka | |

OTHER PUBLICATIONS

Korean Notice of Allowance issued in corresponding Korean Patent Application No. 10-2018-7035951, dated Sep. 3, 2020.

* cited by examiner

DISPLACEMENT BASED OVERLAY OR ALIGNMENT

CROSS-REFERENCE TO RELATED APPLICATIONS

This application is the U.S. national phase entry of PCT patent application no. PCT/EP2017/059371, which was filed on Apr. 20, 2017, which claims the benefit of priority of U.S. provisional application No. 62/335,430, which was filed on May 12, 2016, and which is incorporated herein in its entirety by reference.

TECHNICAL FIELD

The description herein relates to device patterning apparatuses and processes (e.g., lithography apparatuses and processes).

BACKGROUND

Manufacturing devices, such as semiconductor devices, typically involves processing a substrate (e.g., a semiconductor wafer) using a number of patterning processes and patterning apparatuses to form various features and multiple layers of the devices. Such layers and features are typically patterned using, e.g., deposition, lithography, etch, chemical-mechanical polishing, and ion implantation. Multiple devices may be patterned on a plurality of dies on a substrate and then separated into individual devices. A patterning process may involve a patterning step using a patterning apparatus, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes may be involved in the patterning process.

Metrology processes are used at various steps during a patterning process to monitor and control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), the measurements of the one or more characteristics may be used to alter one or more parameters of the patterning process such that further substrates manufactured by the patterning process have an acceptable characteristic(s).

A lithography apparatus can be used, for example, in a patterning process for the manufacture of integrated circuits (ICs) or other devices. In such a case, a patterning device (e.g., a mask) may contain or provide a circuit pattern corresponding to an individual layer of the device ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithography apparatus, one target portion at a time. In one type of lithography apparatus, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithography apparatus will have a reduction ratio M (e.g., 4), the speed F at which the substrate is moved will be a factor 1/M times that at which the projection beam scans the patterning device.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

SUMMARY

Disclosed herein is a method comprising: obtaining an image of a plurality of structures on a substrate, wherein each of the plurality of structures is formed onto the substrate by transferring a corresponding pattern of a design layout; obtaining a displacement for each of the structures with respect to a reference point for that structure; and assigning, using a hardware computer system, each of the structures into one of a plurality of groups based on the displacement.

According to an embodiment, the image is a SEM image. According to an embodiment, the structures are structures of a photoresist. According to an embodiment, the structures are etched structures in the substrate. According to an embodiment, the structures are deposited structures on the substrate. According to an embodiment, structures assigned to a first group of the plurality of groups and structures assigned to a second group of the plurality of groups are formed at different times. According to an embodiment, structures assigned to a first group of the plurality of groups and structures assigned to a second group of the plurality of groups are formed at different depths. According to an embodiment, structures assigned to a first group of the plurality of groups and structures assigned to a second group of the plurality of groups are formed with radiation having different aberrations. According to an embodiment, the reference points for the plurality of structures are a same point. According to an embodiment, the reference points for the plurality of structures are determined from their respective corresponding patterns. According to an embodiment, the reference points are determined by simulating images of the corresponding patterns. According to an embodiment, obtaining the displacement comprising extracting a contour from the image. According to an embodiment, the method further comprises determining a relative shift, a relative rotation, or both, between structures assigned to a first group and structures assigned to a second group based on the displacements of the structures assigned to the first group and on the displacements of the structures assigned to the second group. According to an embodiment, the method further comprises identifying a defect based on the relative shift, the relative rotation, or both. According to an embodiment, assigning each of the structures into one of a plurality of groups comprises using a clustering algorithm. According to an embodiment, the structures assigned to a same group are able to be linearly mapped to their respective corresponding patterns with a same matrix. According to an embodiment, the matrix is a homogeneous transformation matrix. According to an embodiment, the assigning comprising assigning each of the structures into one of a plurality of groups based on a magnitude of the displacement.

Disclosed herein is a computer program product comprising a non-transitory computer readable medium having instructions recorded thereon, the instructions when executed by a computer implementing any of the methods herein.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION

Figure 1A:
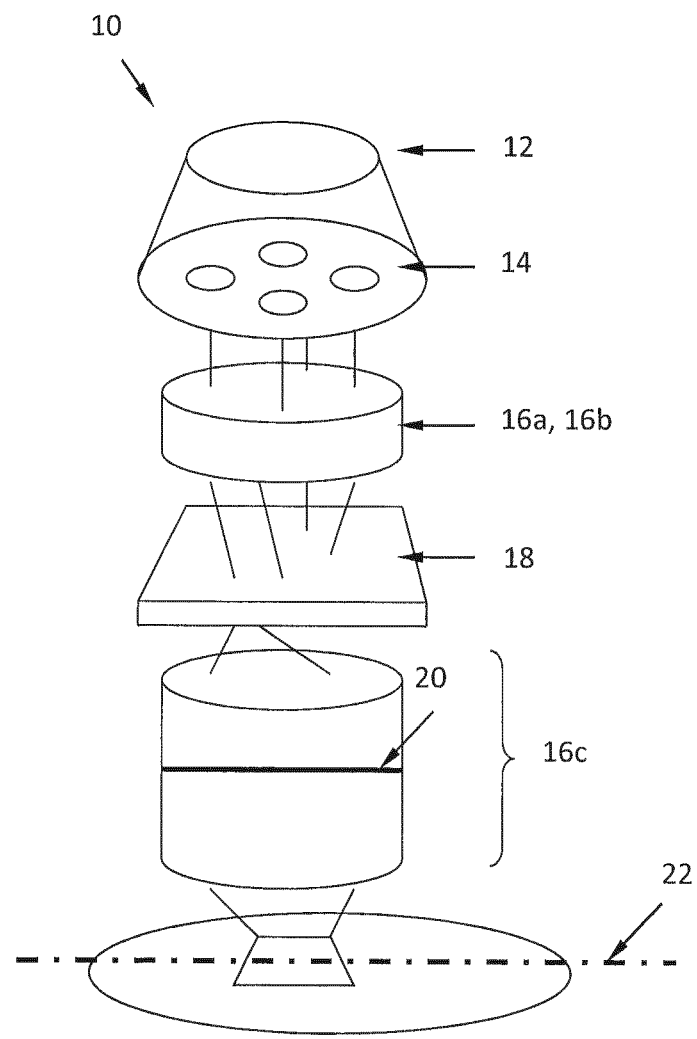
FIG. 1A is a block diagram of various subsystems of a lithography system according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithography apparatuses that project a design layout onto a substrate using illumination from a deep-ultraviolet (e.g., 13.52 nm) illumination source or an extreme-ultraviolet illumination source, creating individual functional elements having dimensions well below 30 nm.

This process in which features with dimensions smaller than the classical resolution limit of a lithography apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithography apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithography apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithography apparatus, no matter where the optical component is located on an optical path of the lithography apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

As an example, OPC addresses the fact that the final size and placement of an image of the design layout projected on the substrate will not be identical to, or simply depend only on the size and placement of the design layout as represented on the patterning device. It is noted that the terms "mask", "reticle", "patterning device" are utilized interchangeably herein and may include both transmissive and reflective patterning devices. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to help ensure that the projected image of the design layout is in accordance with requirements of a given target circuit design, proximity effects should be predicted and compensated for, using sophisticated numerical models, corrections or pre-distortions of the design layout. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an exact science, but an empirical, iterative process that does not always compensate for all possible proximity effect. Therefore, effect of OPC, e.g., design layouts after application of OPC and any other RET, should be verified by design inspection, i.e. intensive full-chip simulation using calibrated numerical process models, in order to minimize the possibility of design flaws being built into the patterning device pattern.

One of the simplest forms of OPC is selective bias. Given a CD vs. pitch curve, all of the different pitches could be forced to produce the same CD, at least at best focus and exposure, by changing the CD at the mask level. Thus, if a feature prints too small at the wafer level, the mask level feature would be biased to be slightly larger than nominal, and vice versa. Since the pattern transfer process from mask level to wafer level is non-linear, the amount of bias is not simply the measured CD error at best focus and exposure times the reduction ratio M, but with modeling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. Therefore, the "best" bias to give identical CD vs. pitch may even have a negative impact on the overall process window, reducing rather than enlarging the focus and exposure range within which all of the target features print on the wafer within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the key goals of integrated circuit design and manufacturing is to maximize the number of functional elements while minimizing the area required per chip, adding excess spacing is a highly undesirable solution.

Two-dimensional OPC approaches may help solve the line end pull back problem. Extra structures (also known as "assist features") such as "hammerheads" or "serifs" may be added to line ends to effectively anchor them in place and provide reduced pull back over the entire process window. Even at best focus and exposure these extra structures are not resolved but they alter the appearance of the design feature without being fully resolved on their own. A "design feature" as used herein means a feature intended to print on a wafer under some or all conditions in the process window and having some function in the circuits eventually produced. Assist features can take on much more aggressive forms than simple hammerheads added to line ends, to the extent the pattern on the mask is no longer simply the desired wafer pattern upsized by the inverse of the reduction ratio M. Assist features such as serifs can be applied to many more cases than simply reducing line end pull back. Inner or outer serifs can be applied to any edge, especially two dimensional edges, to reduce corner rounding or edge extrusions. With enough selective biasing and assist features of all sizes and polarities, the features on the mask bear less and less of a resemblance to the final pattern desired at the wafer level. In general, the mask pattern becomes a pre-distorted version of the wafer-level pattern, where the distortion is intended to counteract or reverse the pattern deformation that will occur during the lithography process to produce a pattern on the wafer that is as close to the one intended by the designer as possible.

Another OPC technique involves using completely independent and non-resolvable assist features, instead of or in addition to those assist features (e.g., serifs) connected to the design features. The term "independent" here means that edges of these assist features are not connected to edges of the design features. These independent assist features are not intended or desired to print as features on the wafer, but rather are intended to modify the aerial image of a nearby design feature to enhance the printability and process tolerance of that design feature. These assist features (often referred to as "scattering bars" or "SBAR") can include sub-resolution assist features (SRAF) which are features outside edges of the design features and sub-resolution inverse features (SRIF) which are features scooped out from inside the edges of the design features. The presence of SBAR adds yet another layer of complexity to a mask. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the mask level.

Both OPC and full-chip RET verification may be based on numerical modeling systems and methods.

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity. Numerous illumination source optimization approaches can be used.

For low $k_1$ photolithography, optimization of both the source and patterning device is useful to ensure a viable process window for projection of critical circuit patterns. Some algorithms discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a patterning process, for example, a parameter a user of the lithography apparatus can adjust. It should be appreciated that any characteristics of a patterning process, including those of the source, the patterning device, the projection optics, and/or resist characteristics can be among the design variables. The cost function is often a non-linear function of the design variables. Then standard optimization techniques are used to minimize or maximize the cost function.

Relatedly, to help ensure that circuit design can be produced on to the substrate with workable process window, source-patterning device optimization (referred to herein as source-mask optimization or SMO) can be used. A source and patterning device (design layout) optimization method and system that allows for simultaneous optimization of the source and patterning device using a cost function without constraints and within a practicable amount of time is described in PCT Patent Application Publication No. WO 2010/059954, which is hereby incorporated by reference in its entirety. Another source and patterning device optimization method and system that involves optimizing the source by adjusting pixels of the source is described in U.S. Patent Application Publication No. US 2010-0315614, which is hereby incorporated by reference in its entirety.

Although specific reference may be made in this text to the use of the embodiments in the manufacture of ICs, it should be explicitly understood that the embodiments has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "wafer" or "die" in this text should be considered as interchangeable with the more general terms "substrate" and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a patterning process parameter, such as a lithography apparatus parameter, such that results and/or processes of the patterning process have more desirable characteristics, such as higher accuracy of projection of design layouts on a substrate, larger process windows, etc.

Further, the lithography apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithography apparatuses are described, for example, in U.S. Pat. No. 5,969,441, incorporated herein by reference.

The patterning device referred to above represents design layouts. The design layouts can be generated utilizing CAD (computer-aided design) programs, this process often being referred to as EDA (electronic design automation). Most CAD programs follow a set of design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. One of the goals in integrated circuit fabrication is to faithfully reproduce the original circuit design on the substrate (via the patterning device).

The term patterning device as employed in this text may be broadly interpreted as referring to generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The matrix addressing can be performed using suitable electronics.

a programmable LCD array.

Figure 1B:
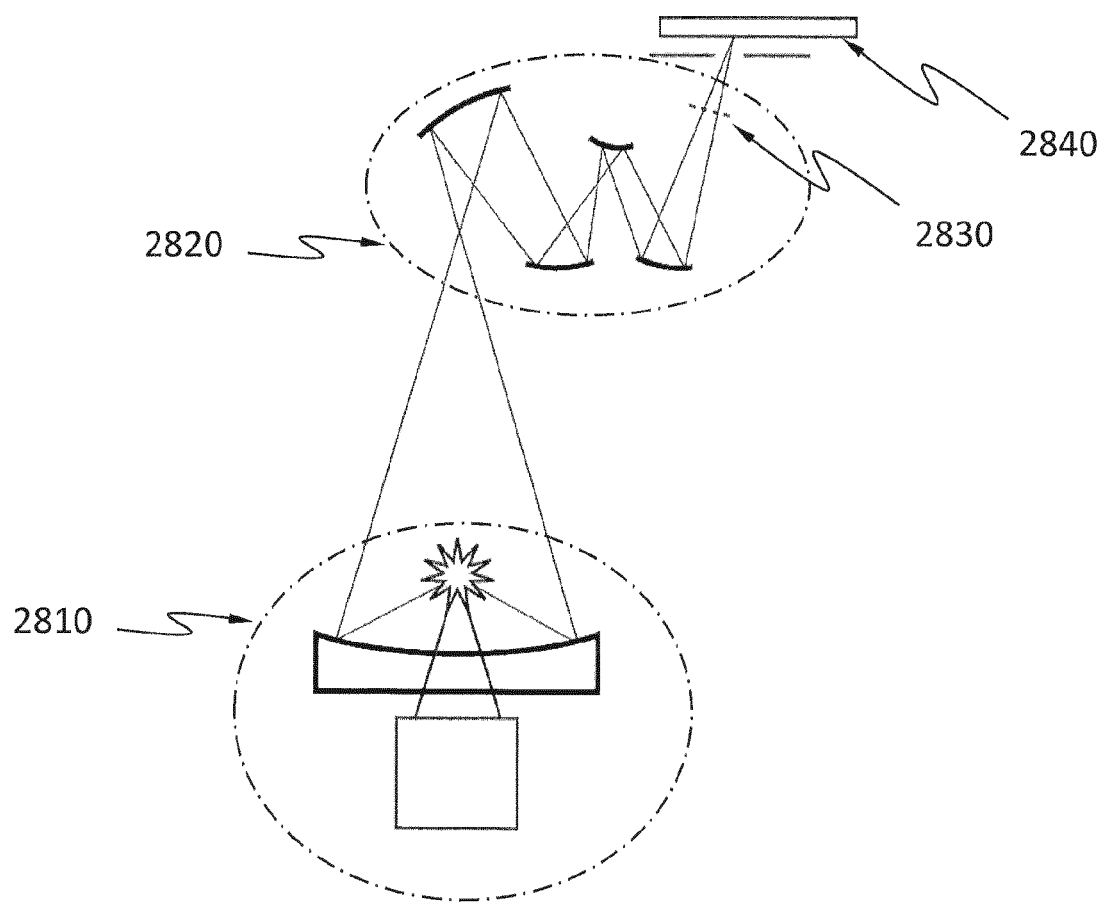
FIG. 1B shows a schematic of an illumination source.

As a brief introduction, FIG. 1A highly schematically illustrates an example lithography apparatus. Major components are an illumination source 12, which may be a deep-ultraviolet excimer laser source or other type of sources including extreme ultra violet (EUV) sources, illumination optics which define the partial coherence (denoted as sigma) and which may include optics 14, 16a and 16b that shape radiation from the source 12; a patterning device (e.g., a mask or reticle) 18; and transmission optics 16c that project an image of the patterning device pattern onto a substrate plane 22. An adjustable filter or aperture 20 at the pupil plane of the projection optics may restrict the range of beam angles that impinge on the substrate plane 22, where the largest possible angle defines the numerical aperture of the projection optics $NA=\sin(\Theta_{max})$. The term "source" and "illumination source" as used herein may include illumination optics. For example, FIG. 1B shows an EUV illumination source including a source collector module 2810 and illumination optics 2820. In the source collector module 2810, EUV radiation may be produced by a plasma. The EUV radiation is then shaped by the illumination optics 2820 and directed to a patterning device 2840. A pupil at a plane between the patterning device 2840 and the illumination optics 2820 may be referred to as an illumination pupil. The "shape" of the illumination source refers to the intensity and/or phase distribution at the illumination pupil.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations. The term "evaluation points" herein should be interpreted broadly to include any characteristics of the system. The design variables of the system can be confined to finite ranges and/or be interdependent due to practicalities of implementations of the system. In case of a lithography apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithography apparatus, a source provides illumination (i.e. radiation); projection optics direct and shapes the illumination via a patterning device and onto a substrate. The term "projection optics" is broadly defined here to include any optical component that may alter the wavefront of the radiation beam. For example, projection optics may include at least some of the components 14, 16a, 16b and 16c. An aerial image (AI) is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithography apparatus (e.g., properties of the source, the patterning device and the projection optics) dictate the aerial image. Since the patterning device used in the lithography apparatus can be changed, it is desirable to separate the optical properties of the patterning device from the optical properties of the rest of the lithography apparatus including at least the source and the projection optics.

Figure 1C:
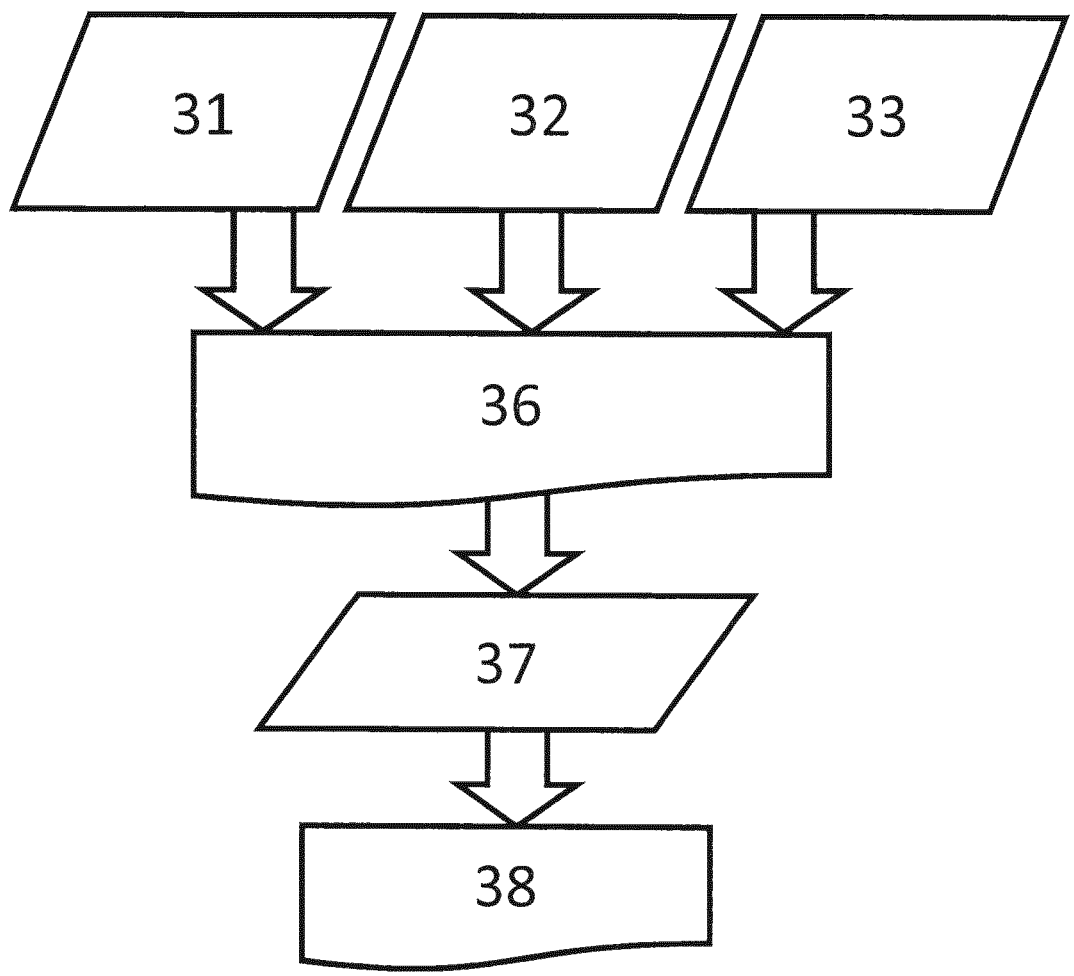
FIG. 1C is a block diagram of simulation models corresponding to the subsystems in FIG. 1A.

A flow chart for simulating lithography in a lithography apparatus is illustrated in FIG. 1C. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. The projection optics model 32 may include aberration caused by various factors, for example, heating of the components of the projection optics, stress caused by mechanical connections of the components of the projection optics. The source model 31 and the projection optics model 32 can be combined into a transmission cross coefficient (TCC) model. A design layout model 33 represents optical characteristics (including changes to the radiation intensity distribution and/or the phase distribution caused by a given design layout) of a design layout, which is the representation of an arrangement of features of a patterning device. An aerial image 36 can be simulated from the source model 31, the projection optics model 32 and the design layout model 33. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma ($\sigma$) settings as well as any particular illumination source shape (e.g. off-axis radiation sources such as annular, quadrupole, and dipole, etc.).

The projection optics model 32 can represent the optical characteristics of the of the projection optics that include aberration, distortion, refractive indexes, physical sizes, physical dimensions, absorption, etc. The design layout model 33 can also represent physical properties of a physical patterning device, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or other file format.

A patterning process may include multiple lithography processes, each of which forms an image of a group of patterns onto a substrate. The image of one group of patterns and the image of another group of patterns may be in the same layer of the device being made. For example, if the patterns in the same layer of the device are too dense to be presented by or represented on a single patterning device, the patterns may be separately presented (using the same patterning device or using different patterning device) or be separately represented on a same patterning device or by multiple patterning devices, thereby reducing the density of each of the represented or present patterns (multiple patterning or multi-patterning). Errors in the multiple lithography processes may not be the same. For example, the image formed in a lithography process may have errors such as translation, rotation, scaling, skewing, etc. These errors may be different in different lithography processes. For example, the differences in the errors may be attributed to differences in one or more parameters (e.g., parameters of the source, patterning device, projection optics, etc.) of the lithography processes. Differences in the errors may cause the image formed in one lithography process to shift relative to the image formed in another lithography process. Determining the shift may be important to limit the impact to the patterning process by the shift. However, determining the shift may not be always straightforward. For example, when the difference of errors is not limited to difference of translation errors, the shift becomes location dependent. For example, because all the images in multiple patterning are merged together in the same layer, it is not always obvious which patterning process formed a given part of the merged image and thus difficult to determine the shift.

Figure 2:
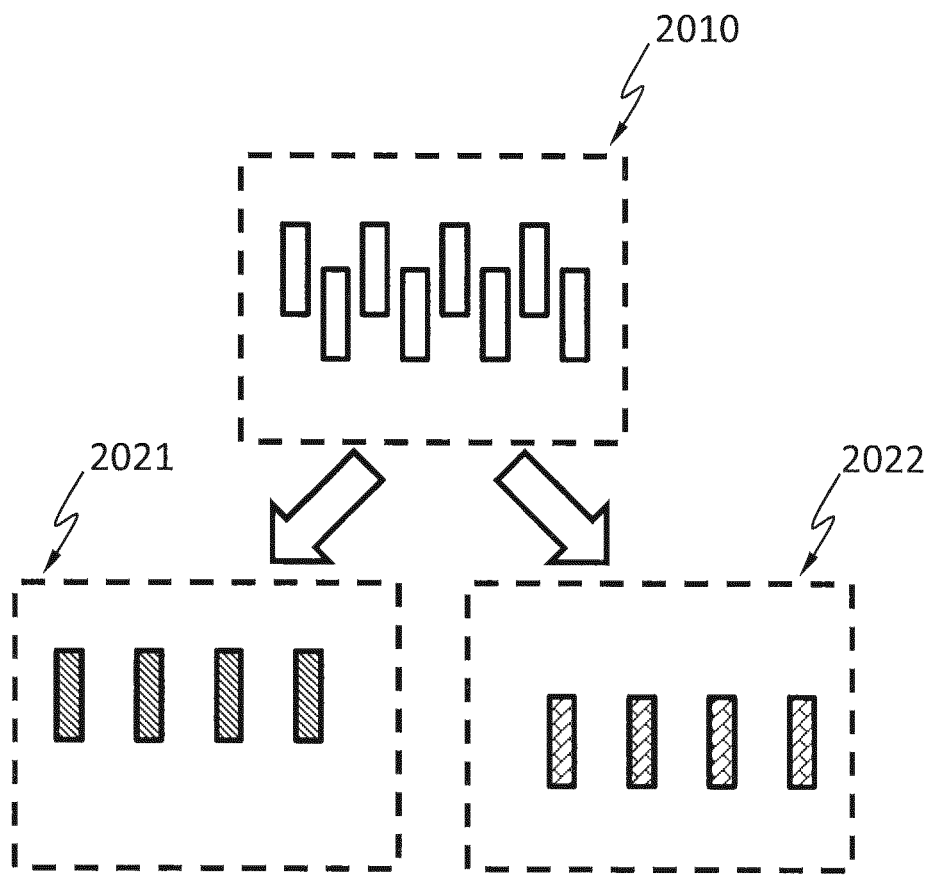
FIG. 2 schematically shows a design layout for a patterning process.

FIG. 2 schematically shows a design layout 2010. In an example of multiple patterning, the design layout 2010 is represented, for example, on multiple patterning devices such as patterning device 2021 and patterning device 2022. Each of the multiple patterning devices represents part of the design layout 2010. Each of the patterns in the design layout 2010 is represented on one and only one patterning device (for exposure onto a particular substrate; of course, there may be multiple copies for other tools or for replacement of a defective patterning device). In this example, the design layout 2010 has two rows of patterns. If all of these patterns are represented on a single patterning device, the patterns in one row are too close to patterns in the other row. Therefore, the patterns in the first row are represented in the patterning device 2021 and the patterns in the second row are represented in the patterning device 2022. The patterning devices 2021 and 2022 are used in separate patterning processes.

Figure 3:
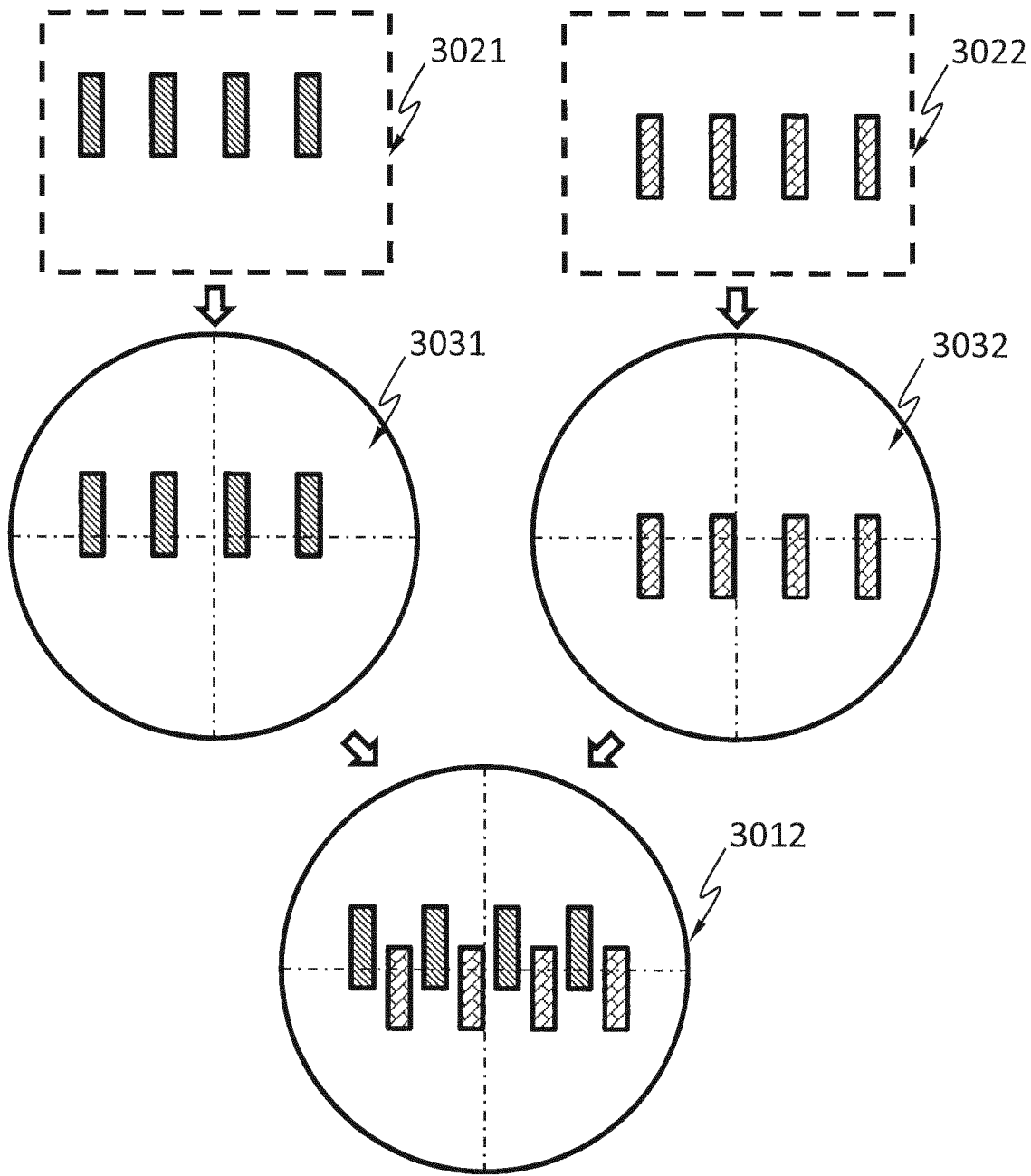
FIG. 3 schematically shows an example of multiple patterning.

FIG. 3 schematically shows an example of multiple patterning. In this example, two patterning devices 3021 and 3022 are respectively used in separate patterning processes. In one of the patterning processes, the patterns represented on the patterning device 3021 are projected to a substrate and form structures 3031. In another of the patterning processes, the patterns represented on the patterning device 3022 are projected to a substrate and form structures 3032. Thus, a combination of the structures 3031 and 3032 is realized on the substrate. Image 3012 is an image of the combination of the structures 3031 and 3032. In this example, the two patterning processes have no difference in translation, rotation, scaling, or skewing error.

Figure 4:
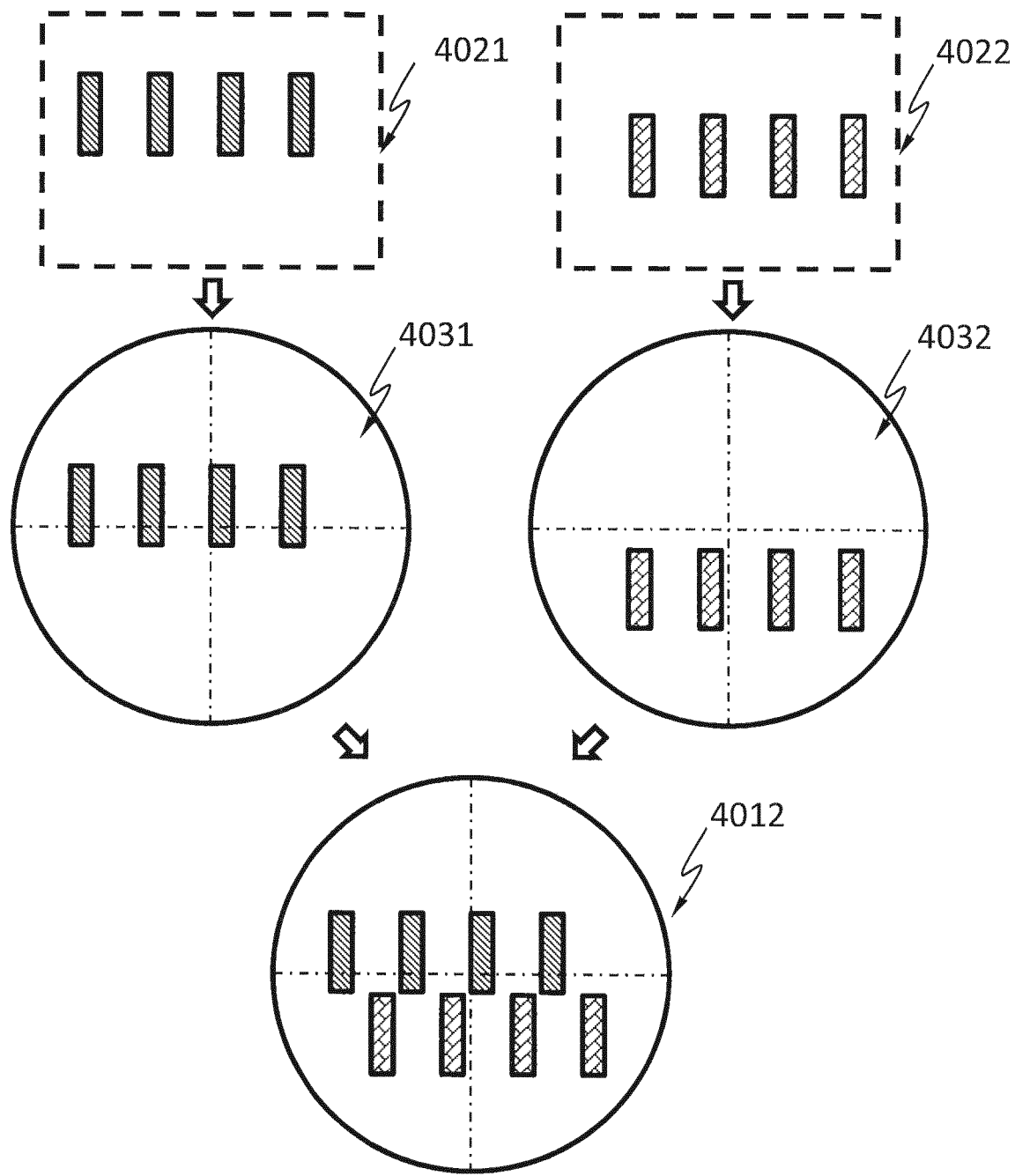
FIG. 4 schematically shows an example of multiple patterning.

FIG. 4 schematically shows an example of multiple patterning. In this example, two patterning devices 4021 and 4022 are respectively used in separate patterning processes. In one of the patterning processes, the patterns represented on the patterning device 4021 are projected to a substrate and form structures 4031. In another of the patterning processes, the patterns represented on the patterning device 4022 are projected to a substrate and form structures 4032. Thus, a combination of the structures 4031 and 4032 is realized on the substrate. Image 4012 is an image of the combination of the structures 4031 and 4032. In this example, the two patterning processes have a difference in translation error, but no difference in rotation, scaling, or skewing error.

Figure 5:
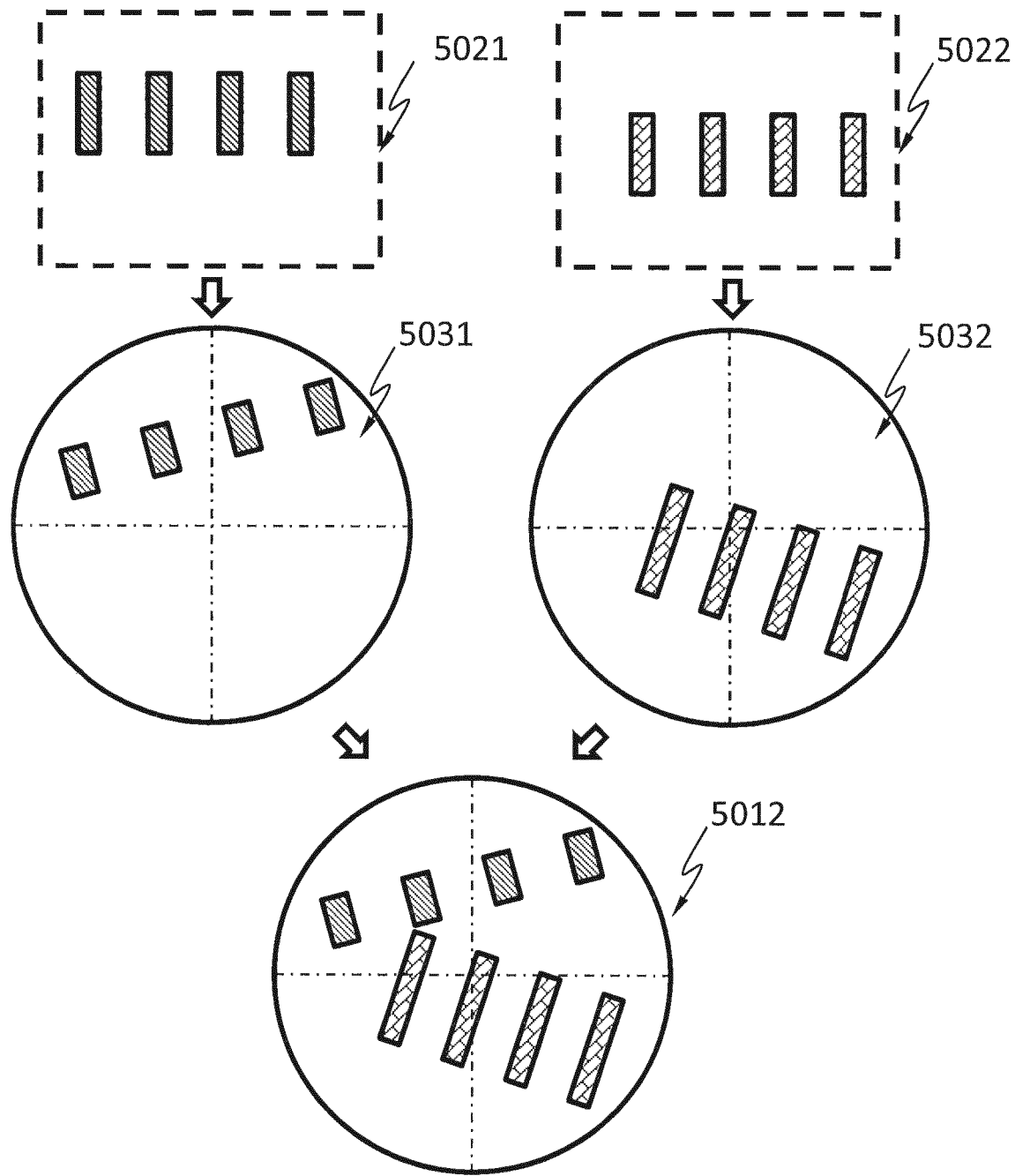
FIG. 5 schematically shows an example of multiple patterning.

FIG. 5 schematically shows an example of multiple patterning. In this example, two patterning devices 5021 and 5022 are respectively used in separate patterning processes. In one of the patterning processes, the patterns represented on the patterning device 5021 are projected to a substrate and form structures 5031. In the other of the patterning processes, the patterns represented on the patterning device 5022 are projected to a substrate and form structures 5032. Thus, a combination of the structures 5031 and 5032 is realized on the substrate. Image 5012 is an image of the combination of the structures 5031 and 5032. In this example, the two patterning processes have differences in translation error, rotation error, and scaling error, but no difference in skewing error.

So, in an embodiment, each of the structures formed on a substrate can have a displacement relative to a reference point. Using the displacements of the structures, the structures may be assigned into one of a plurality of groups. For example, the structures assigned to the same group are formed on the substrate in the same patterning process. For example, the structures assigned to the same group are formed by patterns represented on a same patterning device. The displacements can also be used to identify one or more defects on the substrate, determine one or more alignment errors between groups of structures and/or determine one or more overlay errors between groups of structures.

Figure 6A:
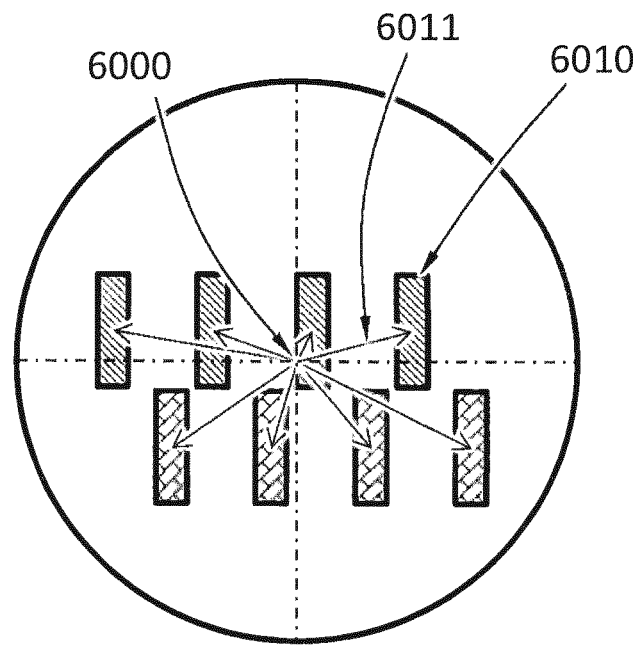
FIG. 6A schematically shows displacements of structures on a substrate or in a die.
Figure 6B:
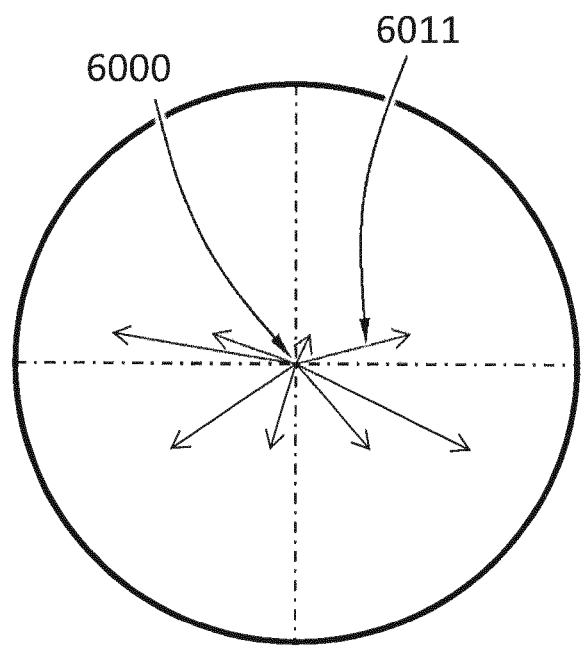
FIG. 6B schematically shows the displacements of the structures of FIG. 6A but not the structures themselves.

FIG. 6A schematically shows that the displacements (e.g., 6011) of all the structures (e.g., 6010) on a substrate or in a die may be relative to a single reference point 6000. The displacement of a given structure may be the vector pointing from the reference point 6000 to a center of gravity or centroid of that structure. Alternatively, the displacement of a given structure may be the vector pointing from a center of gravity or centroid of that structure to the reference point. FIG. 6B shows only the displacements of the structures but not the structures themselves.

Figure 6C:
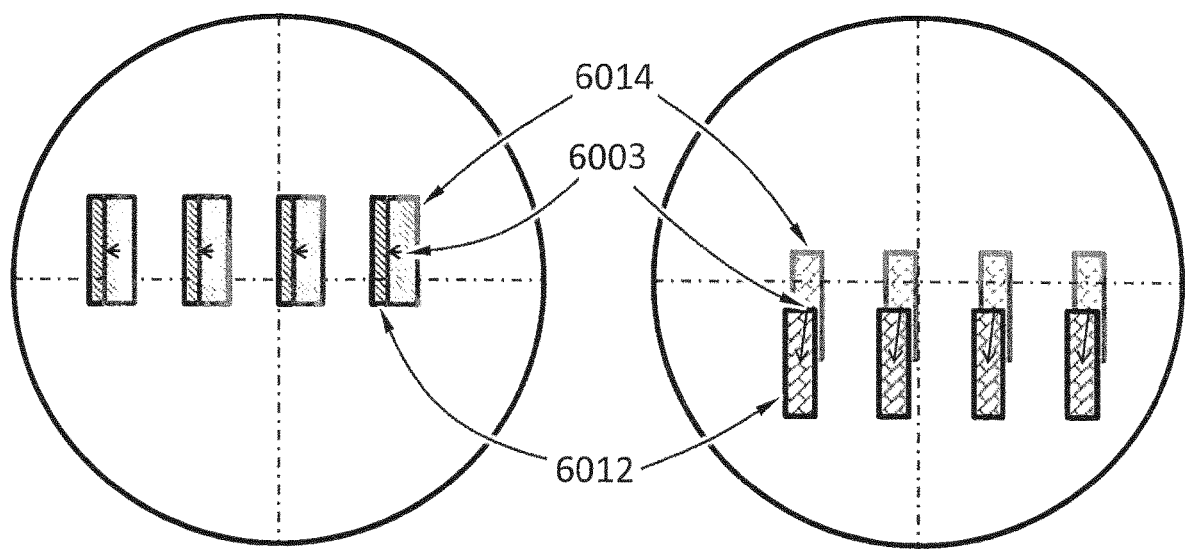
FIG. 6C schematically shows that displacements of structures on the substrate or in a die.
Figure 6D:
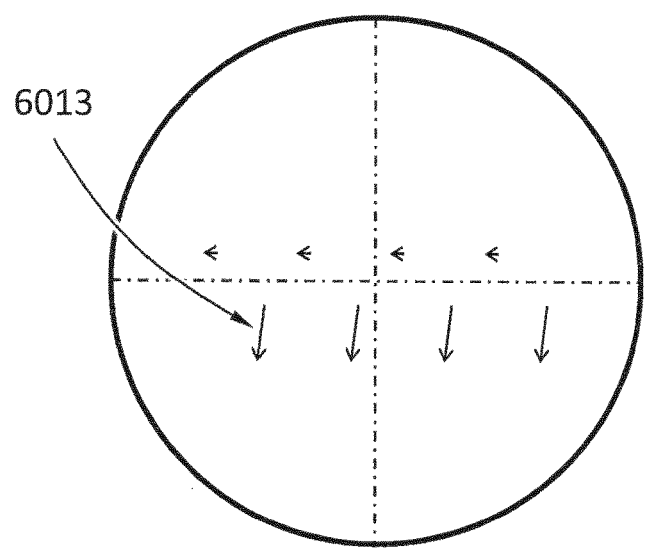
FIG. 6D schematically shows the displacements of the structures of FIG. 6C but not the structures themselves.

FIG. 6C schematically shows that the displacements (e.g., 6013) of all the structures (e.g., 6012) on the substrate or in a die may be relative to different reference points 6003. For example, the displacement of a given structure 6012 may be a vector pointing from where the structure 6012 should be (6014) in the design layout to where the structure 6012 actually is on the substrate. FIG. 6D shows only the displacements of the structures but not the structures themselves.

Figure 6E:
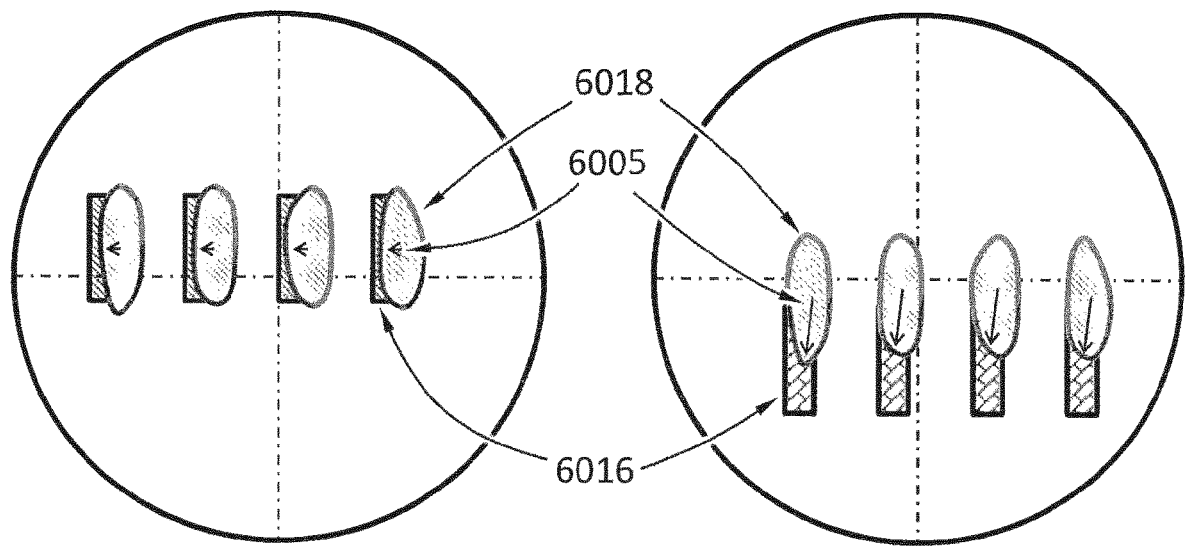
FIG. 6E schematically shows that displacements of structures on the substrate or in a die.
Figure 6F:
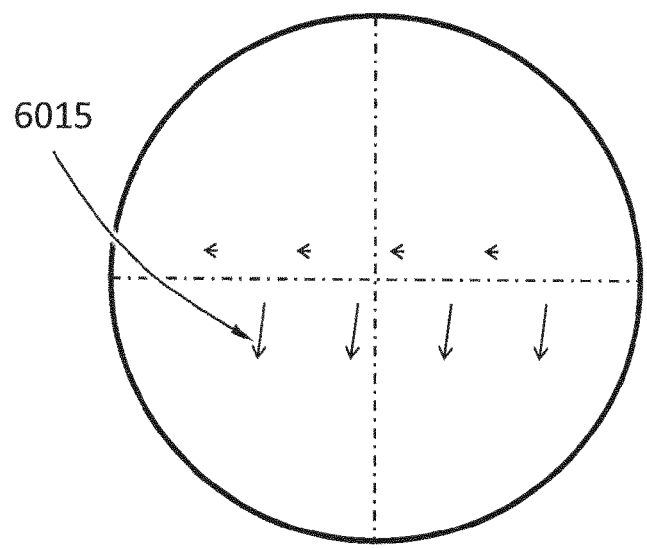
FIG. 6F schematically shows the displacements of the structures of FIG. 6E but not the structures themselves.

FIG. 6E schematically shows that the displacements (e.g., 6015) of all the structures (e.g., 6016) on the substrate or in a die may be relative to different reference points 6005. For example, the displacement of a given structure 6012 may be a vector pointing from where a simulated image (6018) of the structure 6012 is located to where the structure 6012 actually is on the substrate. FIG. 6F shows only the displacements of the structures but not the structures themselves.

The displacements of the structures formed in the same patterning process should be related in one way or another. For example, if the patterning device that presents or represents patterns corresponding to these structures is shifted in a direction, the structures are likely to have the same translation error because there is likely no relative translation among the patterns of the same patterning device. For example, if the patterning device that presents or represents patterns corresponding to these structures is rotated, the structures are likely to have the same rotation error because there is likely no relative rotation or relative translation among the patterns of the same patterning device. In a mathematical form, the patterning process may be represented by a linear mapping (also referred to as linear map or linear transformation), which can be expressed as a matrix. For example, in a Cartesian coordinate system, the matrix for a rotation by angle θ counterclockwise is $$T = \begin{bmatrix} \cos\theta & -\sin\theta \\ \sin\theta & \cos\theta \end{bmatrix}$$

Therefore, the structures formed in the same patterning process should (if there is no aberration) be able to be mapped to their corresponding patterns in the design layout by a same linear mapping, which may be expressed by a same matrix.

Figure 7:
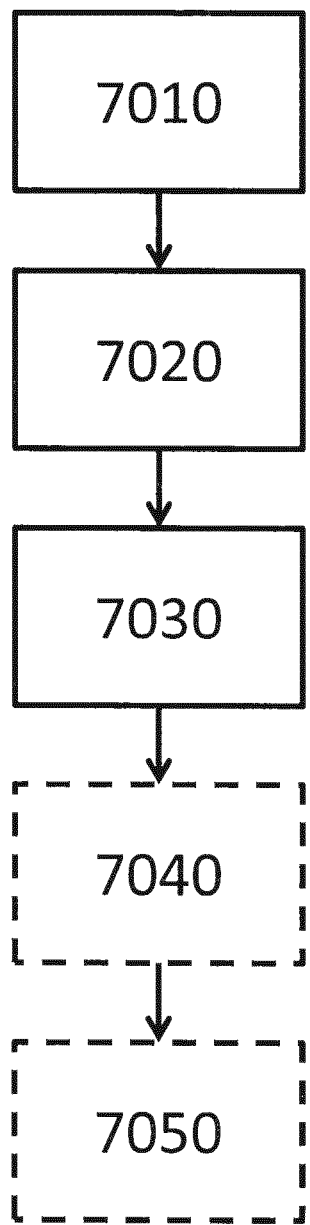
FIG. 7 schematically shows a flow chart for a method.

FIG. 7 schematically shows a flow chart for a method, according to an embodiment. In procedure 7010, an image of a plurality of structures on a substrate is obtained. Each of the plurality of structures is formed onto the substrate by imaging a corresponding pattern of a design layout. The image may be a scanning electron microscopy (SEM) image. The structures may be structures of a photoresist, before or after development of the photoresist. The structures may be etched structures in the substrate. The structures may be deposited structures in the substrate.

In procedure 7020, a displacement for each of the structures with respect to a reference point for that structure is obtained. The reference points for the plurality of structures may be a same point. The reference points for the plurality of structures may be determined from their respective corresponding patterns in the design layout. The reference points for the plurality of structures may be determined by simulating images of the corresponding patterns. One way to obtain the displacement involves extracting one or more contours of the patterns from the image.

In procedure 7030, each of the structures is assigned (e.g., by using a computer system) into one of a plurality of groups based on the displacement. The structures assigned to different groups may be formed at different times. The structures assigned to different groups may be formed at different depths (i.e., in different layers). The structures assigned to different groups may be formed with radiation having different aberrations. The structures assigned to the same group may be able to be linearly mapped to their respective corresponding patterns with a same matrix. The matrix may be a homogeneous transformation matrix (i.e., a matrix representing a homogeneous transformation). One way to assign structures to a plurality of groups by the displacements may include using the magnitudes of the displacements. For example, if the magnitude of the displacement of a structure is between two thresholds, the structure is assigned to one group and if the magnitude is between another two thresholds, the structure is assigned to another group. Another way to assign structures to a plurality of groups by the displacements may be by a clustering algorithm.

In optional procedure 7040, a relative shift (e.g., overlay error, or alignment error), a relative rotation, or both, between structures assigned to one group and structures assigned to another group may be determined based on the displacements of these structures. For example, the relative shift of structures assigned to one group and structures assigned to another group may be the difference between the average displacement of structures assigned to the one group and the average displacement of structures assigned to the other group.

In optional procedure 7050, a defect may be identified based on the relative shift, relative rotation or both.

So, in an embodiment, an image (e.g., SEM) of a patterned substrate has identified structures. Such structures can be identified by contouring or image separation. Design information (e.g., expected shapes and location of the structures) can be used to tag the structures assigning them, for example, a patterning device of origin and/or a particular patterning process of a multiple patterning process of origin. A center of mass of these measured structures can then be used to compare with a center of mass (in x,y) of: a target design, a simulated target, or 0 (no reference). This will provide displacement information of the structures (e.g., per exposed split of a multi-patterning process). By plotting the difference between the different structures (e.g., the structures of a particular patterning process of a multiple patterning process and the structures of another particular patterning process of the multiple patterning process), a fingerprint of a parameter of interest (e.g., overlay) can be plotted with high accuracy. This analysis can be used to determine or verify overlay in a multi-patterning process. Overlay can be determined in more than one direction, e.g., two directions.

In addition, a bridging detector can be used on the contours to indicate which locations are expected to be inside the process window. Further, with the image and the structures identified, other parameters can be assessed as well, such as necking and/or pinching of lines, and relative displacement of the features within the same exposure, to control, e.g., edge placement errors and/or pattern shift uniformity on the actual product.

Thus, in an embodiment, on product overlay is measured with high accuracy in a way that can be automated. To enable this, in an embodiment, design information can be used for decomposition of the image into the splits of a multi patterning layer. In an embodiment, segmentation and/or extracted contours of the image is used to identify structures for overlay determination. The structures are then image processed to determine the displacements for overlay determination.

While the discussion herein has focused on a multiple patterning embodiment, the disclosure herein can also be used for a traditional single patterning arrangement with structures in different layers. For example, the structures of a lower and upper layer can be identified and then the method can be used with a traditional overlay measurement or analysis.

In an embodiment, the structural offset measurement can be used to identify differences in shifts between different structures in a single layer due to, e.g., optical aberrations.

The concepts and results disclosed herein may be used to calibrate or modify any simulation or mathematical model of the patterning process, such as one that simulates or models any generic imaging system for imaging sub-micron features. The concepts and results disclosed herein may be used to control the patterning process by, for example, modifying one or more design variables. The concepts and results disclosed herein may be used to design the patterning process by, for example, modifying one or more design variables. The concepts and results disclosed herein may be used to monitor the patterning process by, for example, identifying whether one or more defects have occurred or whether one or more defects are likely to occur. The concepts and results disclosed herein may be used to create or calibrate a model predictive control system that, for example, regulates defects.

Figure 8:
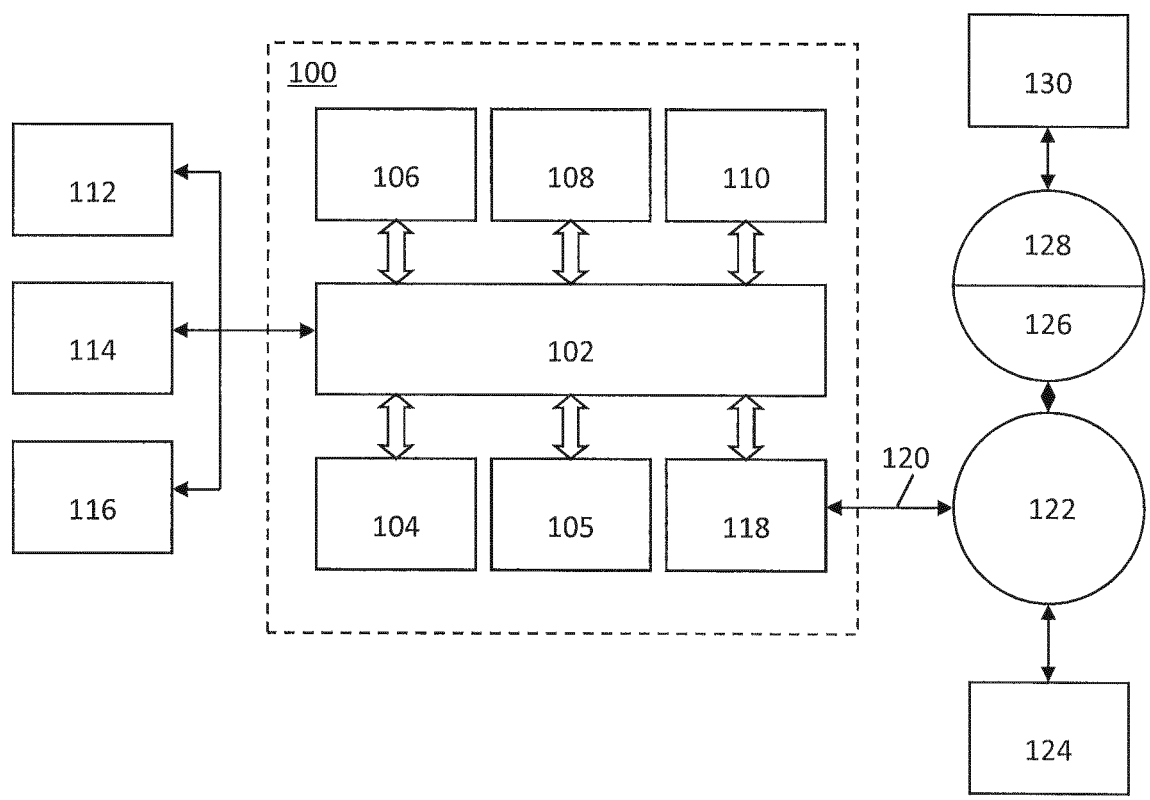
FIG. 8 is a block diagram of an example computer system.

FIG. 8 is a block diagram that illustrates a computer system 100 which can assist in implementing a method and/or flow disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a method described herein may be performed by computer system 100 in response to processor 104 executing one or more sequences of one or more instructions. In an embodiment, the computer system 100 can be part of a lithographic apparatus, part of a metrology system, a stand-alone system is connected to the lithographic apparatus and/or metrology system, etc.

Such instructions may be contained in main memory 106 and may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for an implementation of a method described herein, for example. The received code may be executed by processor 104 as it is received, and/or stored in storage device 110, or other non-volatile storage for later execution. In this manner, computer system 100 may obtain application code in the form of a carrier wave.

Figure 9:
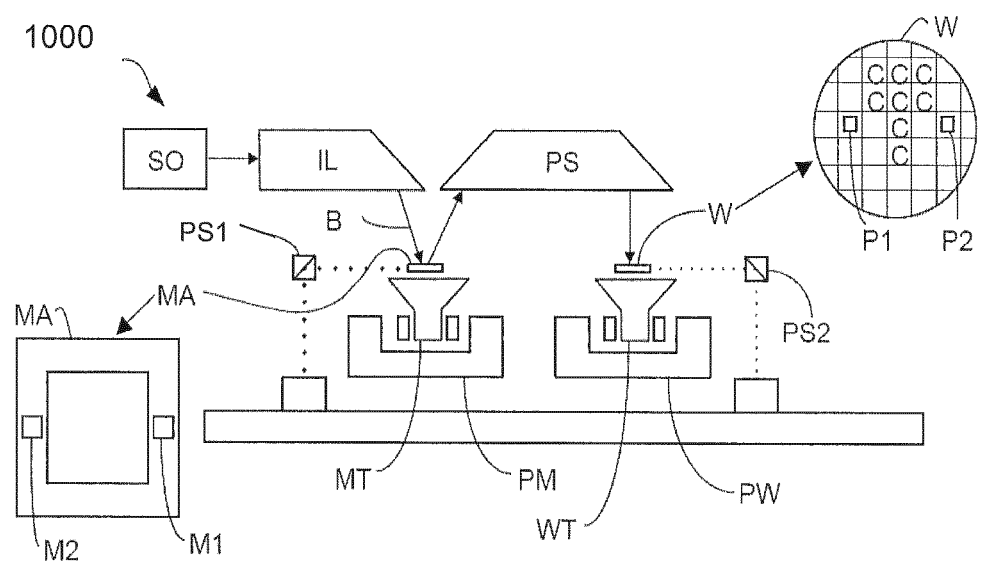
FIG. 9 is a schematic diagram of another lithography apparatus.

FIG. 9 schematically depicts another lithography apparatus 1000. The lithography apparatus 1000 includes:
- a source collector module SO
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 9, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 9, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithography apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 10:
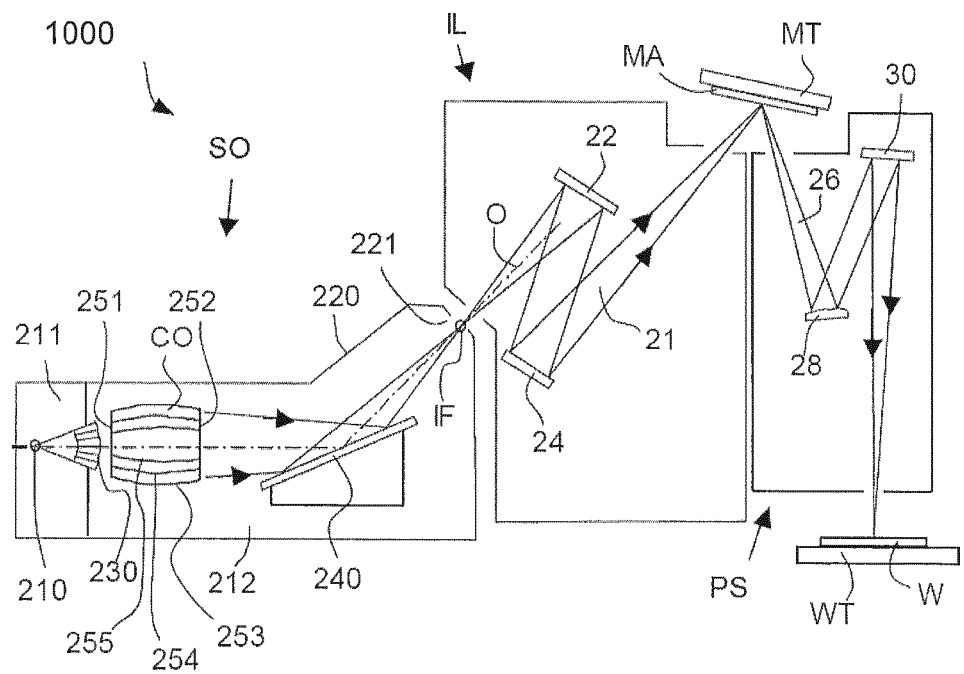
FIG. 10 is a more detailed view of the apparatus in FIG. 9.

FIG. 10 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be used for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line '0'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithography apparatus. Further, there may be more mirrors present than those shown in the figures, for example there may be 1-6 additional reflective elements present in the projection system PS than shown in FIG. 10.

Collector optic CO, as illustrated in FIG. 10, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 11:
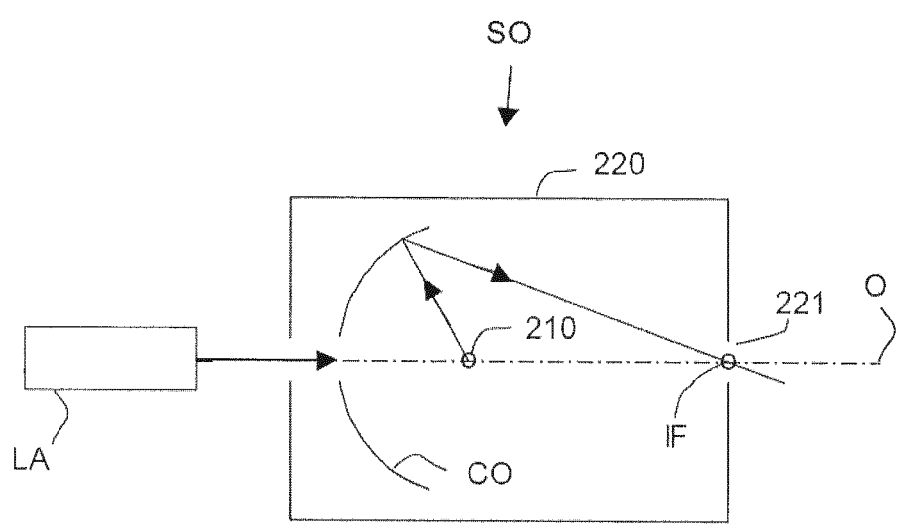
FIG. 11 is a more detailed view of the source collector module SO of the apparatus of FIG. 9 and FIG. 10.

Alternatively, the source collector module SO may be part of an LPP radiation system as shown in FIG. 11. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method comprising:
   obtaining an image of a plurality of structures on a substrate, wherein each of the plurality of structures is formed onto the substrate by transferring a corresponding pattern of a design layout;
   obtaining a displacement for each of the structures with respect to a reference point for that structure; and
   assigning, using a hardware computer system, each of the structures into one of a plurality of groups based on the displacement.
2. The method of clause 1, wherein the image is a SEM image.
3. The method of clause 1 or clause 2, wherein the structures are structures of a photoresist.
4. The method of clause 1 or clause 2, wherein the structures are etched structures in the substrate.
5. The method of clause 1 or clause 2, wherein the structures are deposited structures on the substrate.
6. The method of any of clauses 1 to 5, wherein structures assigned to a first group of the plurality of groups and structures assigned to a second group of the plurality of groups are formed at different times.
7. The method of any of clauses 1 to 6, wherein structures assigned to a first group of the plurality of groups and structures assigned to a second group of the plurality of groups are formed at different depths.
8. The method of any of clauses 1 to 7, wherein structures assigned to a first group of the plurality of groups and structures assigned to a second group of the plurality of groups are formed with radiation having different aberrations.
9. The method of any of clauses 1 to 8, wherein the reference points for the plurality of structures are a same point.
10. The method of any of clauses 1 to 8, wherein the reference points for the plurality of structures are determined from their respective corresponding patterns.
11. The method of any of clauses 1 to 8, wherein the reference points are determined by simulating images of the corresponding patterns.
12. The method of any of clauses 1 to 11, wherein obtaining the displacement comprises extracting a contour from the image.
13. The method of any of clauses 1 to 12, further comprising determining a relative shift, a relative rotation, or both, between structures assigned to a first group and structures assigned to a second group based on the displacements of the structures assigned to the first group and on the displacements of the structures assigned to the second group.
14. The method of clause 13, further comprising identifying a defect based on the relative shift, the relative rotation, or both.

15. The method of any of clauses 1 to 14, wherein assigning each of the structures into one of a plurality of groups comprises using a clustering algorithm.

16. The method of any of clauses 1 to 15, wherein the structures assigned to a same group are able to be linearly mapped to their respective corresponding patterns with a same matrix.

17. The method of clause 16, wherein the matrix is a homogeneous transformation matrix.

18. The method of any of clauses 1 to 17, wherein the assigning comprising assigning each of the structures into one of a plurality of groups based on a magnitude of the displacement.

19. A computer program product comprising a non-transitory computer readable medium having instructions recorded thereon, the instructions when executed by a computer implementing the method of any of clauses 1 to 18.

The techniques herein may be useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

The descriptions above are intended to be illustrative, not limiting. Thus, it will be apparent to one skilled in the art that modifications may be made to the embodiments as described without departing from the scope of the claims set out below.

What is claimed is:

1. A method comprising:
   obtaining an image of a plurality of structures on a substrate, wherein each structure of the plurality of structures is formed onto the substrate by transferring a corresponding pattern of a design layout;
   obtaining, from the image, a displacement for each of the structures with respect to a reference point for that structure, wherein the displacement corresponds to a shift of a center, centroid or center of mass of that structure and wherein the reference point for that structure is a common reference point, for the structures, within a two dimensional field that spans the structures together or is a reference point from a plurality of spatially-separated reference points, for the structures, within a two dimensional field that spans the structures together; and
   assigning, using a hardware computer system, each of the structures into one of a plurality of groups based on the displacement.

2. The method of claim 1, wherein the image is a SEM image.

3. The method of claim 1, wherein the structures are structures of a photoresist, or wherein the structures are etched structures in the substrate, or wherein the structures are deposited structures on the substrate.

4. The method of claim 1, wherein structures assigned to a first group of the plurality of groups and structures assigned to a second group of the plurality of groups are formed at different times, and/or wherein structures assigned to a first group of the plurality of groups and structures assigned to a second group of the plurality of groups are formed at different depths, and/or wherein structures assigned to a first group of the plurality of groups and structures assigned to a second group of the plurality of groups are formed with radiation having different aberrations.

5. The method of claim 1, wherein the reference points for the plurality of structures are a same point.

6. The method of claim 1, wherein the reference points for the plurality of structures are determined from their respective corresponding patterns.

7. The method of claim 1, wherein the reference points are determined by simulating images of the corresponding patterns.

8. The method of claim 1, wherein obtaining the displacement comprises extracting a contour from the image.

9. The method of claim 1, further comprising determining a relative shift, a relative rotation, or both, between structures assigned to a first group and structures assigned to a second group based on the displacements of the structures assigned to the first group and on the displacements of the structures assigned to the second group.

10. The method of claim 9, further comprising identifying a defect based on the relative shift, the relative rotation, or both.

11. The method of claim 1, wherein assigning each of the structures into one of a plurality of groups comprises using a clustering algorithm.

12. The method of claim 1, wherein the structures assigned to a same group are able to be linearly mapped to their respective corresponding patterns with a same matrix.

13. The method of claim 12, wherein the matrix is a homogeneous transformation matrix.

14. The method of claim 1, wherein the assigning comprises assigning each of the structures into one of a plurality of groups based on a magnitude of the displacement.

15. A computer program product comprising a non-transitory computer readable medium having instructions recorded thereon, the instructions when executed by a computer system, configured to cause the computer system to at least:
   obtain an image of a plurality of structures on a substrate, wherein each of the plurality of structures is formed onto the substrate by transferring a corresponding pattern of a design layout;
   obtain, from the image, a displacement for each of the structures with respect to a reference point for that structure, wherein the displacement corresponds to a shift of a center, centroid or center of mass of that structure and wherein the reference point for that structure is a common reference point, for the structures, within a two dimensional field that spans the structures together or is a reference point from a plurality of spatially-separated reference points, for the structures, within a two dimensional field that spans the structures together; and assign each of the structures into one of a plurality of groups based on the displacement.

16. The computer program product of claim 15, wherein the image is a SEM image.

17. The computer program product of claim 15, wherein structures assigned to a first group of the plurality of groups and structures assigned to a second group of the plurality of groups are formed at different times, and/or wherein structures assigned to a first group of the plurality of groups and structures assigned to a second group of the plurality of groups are formed at different depths, and/or wherein structures assigned to a first group of the plurality of groups and structures assigned to a second group of the plurality of groups are formed with radiation having different aberrations.

18. The computer program product of claim 15, wherein the reference points are determined by simulating images of the corresponding patterns.

19. The computer program product of claim 15, wherein the instructions are further configured to cause the computer system to determine a relative shift, a relative rotation, or both, between structures assigned to a first group and structures assigned to a second group based on the displacements of the structures assigned to the first group and on the displacements of the structures assigned to the second group.

20. The computer program product of claim 19, wherein the instructions are further configured to cause the computer system to identify a defect based on the relative shift, the relative rotation, or both.

21. A computer program product comprising a non-transitory computer readable medium having instructions recorded thereon, the instructions when executed by a computer system, configured to cause the computer system to at least:

obtain an image of a plurality of structures on a substrate, wherein each of the plurality of structures is formed onto the substrate by transferring a corresponding pattern of a design layout;

obtain, from the image, a displacement for each of the structures with respect to a reference point for that structure; and assign each of the structures into one of a plurality of groups based on the displacement, wherein the structures assigned to a same group are able to be linearly mapped to their respective corresponding patterns with a same linear transformation or mapping.

* * * * *